United States Patent [19]

Housako

[11] Patent Number: 5,406,132
[45] Date of Patent: Apr. 11, 1995

[54] WAVEFORM SHAPER FOR SEMICONDUCTOR TESTING DEVICES

[75] Inventor: Takahiro Housako, Gyoda, Japan

[73] Assignee: Advantest Corporation, Tokyo, Japan

[21] Appl. No.: 117,098

[22] PCT Filed: Jan. 20, 1993

[86] PCT No.: PCT/JP93/00062
§ 371 Date: Sep. 15, 1993
§ 102(e) Date: Sep. 15, 1993

[87] PCT Pub. No.: WO93/14412
PCT Pub. Date: Jul. 22, 1993

[30] Foreign Application Priority Data

Jan. 21, 1992 [JP] Japan .................. 4-008101

[51] Int. Cl.6 .......................... G01R 31/28
[52] U.S. Cl. .................... 327/172; 371/27;
                                327/100; 327/294
[58] Field of Search ............... 307/265-269;
                        328/59, 60, 61; 371/15.1, 24, 27

[56] References Cited

U.S. PATENT DOCUMENTS

| 4,635,096 | 1/1987 | Morgan ................ 371/27 |
| 4,788,684 | 11/1988 | Kawaguchi et al. ....... 371/27 |
| 5,003,194 | 3/1991 | Engelhard ............. 307/265 |
| 5,170,398 | 12/1992 | Fujieda et al. .......... 371/27 |

FOREIGN PATENT DOCUMENTS

| 60-194375 | 10/1985 | Japan . |
| 63-19026 | 4/1988 | Japan . |
| 0098576 | 4/1988 | Japan ................ 307/268 |
| 0172779 | 7/1989 | Japan . |
| 0222577 | 1/1990 | Japan . |
| 0145011 | 6/1990 | Japan ................ 307/268 |
| 405119121 | 5/1993 | Japan ................ 371/27 |

Primary Examiner—Timothy P. Callahan
Assistant Examiner—T. Lam
Attorney, Agent, or Firm—Staas & Halsey

[57] ABSTRACT

A plurality of clock signals, which determine the edge timing of a driver output waveform, are generated by a timing generator. Pattern data and control data synchronized therewith from selecting a waveform mode in real time are generated by a patter generator. An enable data generator generates enable data which determines whether to use A, B and C clock signals ACK, BCK and CCK which determine the edge timing of the driver output waveform, on the basis of a selected one of a plurality of waveform modes stored in a storage and the pattern data. A waveform generator generates the driver output waveform on the basis of the enable data and the A, B, and C clock signals which determine the edge timing of the driver output waveform.

5 Claims, 9 Drawing Sheets

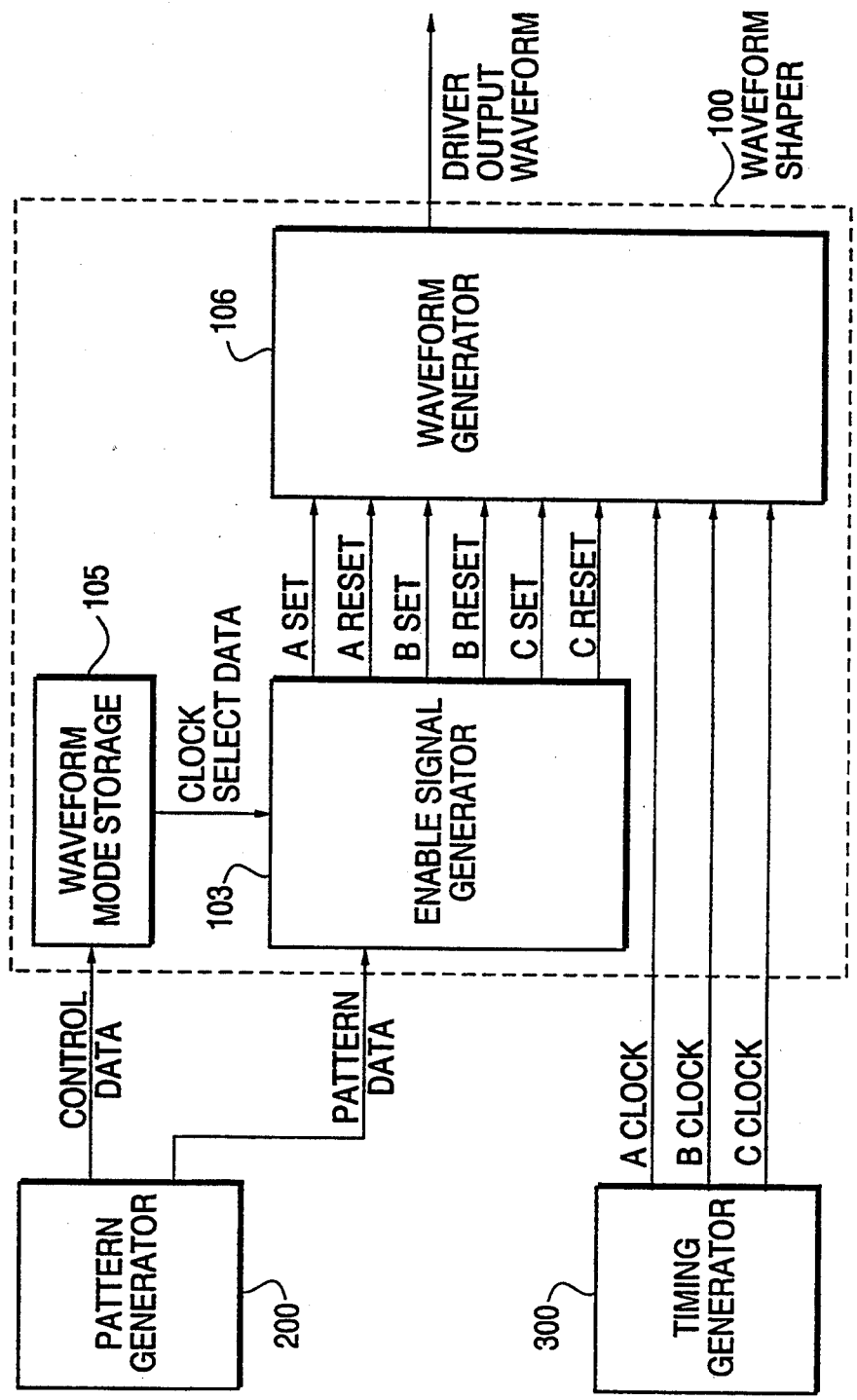

WAVEFORM SHAPER FOR SEMICONDUCTOR TESTING DEVICES

FIELD OF THE PRESENT INVENTION

The present invention relates to a waveform shaper for semiconductor testing devices and, more particularly, to a wave-form shaper for semiconductor devices which switches, in real time, the waveform mode that determines the driver waveform which is applied to a semiconductor to be tested.

DESCRIPTION OF THE RELATED ART

Referring first to a block diagram shown in FIG. 1, a conventional waveform shaper will be outlined. A waveform shaper 100 has built therein one waveform mode register 105, wherein a waveform mode is preset. The waveform mode register 105 has an 8-bit width and the meaning of each bit is such as given below in Table 1.

TABLE 1

| Name | Meaning |
|---|---|
| SEL A | This means selecting clock A as a SET or RESET signal; the clock is selected as the RESET signal or SET signal, depending on whether pattern data from a pattern generator is a "0" or "1." |
| SEL SET B | This means selecting clock B as the SET signal; the clock is selected or not, depending on a whether the pattern data from the pattern generator is a "1" or "0." |
| SEL RESET B | This means selecting clock B as the RESET signal; the clock is selected or not, depending on whether the pattern data from the pattern generator is a "0" or "1." |
| SEL SET C | This means selecting clock C as the SET signal; the clock is selected or not, depending on whether the pattern data from the pattern generator is a "1" or "0." |
| SEL RESET C | This means selecting clock C as the RESET signal; the clock is selected or not, depending on whether the pattern data from the pattern generator is a "0" or "1." |
| INV A | This inverts the relationship between the pattern data and the selection of signals in SEL A. |
| INV B | This inverts the relationship between the pattern data and the selection of signals in SEL SET B and SEL RESET B. |
| INV C | This inverts the relationship between the pattern data and the selection of signals in SEL SET C and SEL RESET C. |

Meaning of Each Bit of waveform Mode Register

A brief description of a conventional phase change circuit will be given, with reference to a block diagram of FIG. 2 and a timing chart of FIG. 3. A phase change circuit 101 is to changes pattern data, which is generated by a pattern generator 200 in FIG. 1, from the phase of an M clock signal (a clock signal synchronized with a pattern data cycle) MCK, which is available from a timing generator 300, to the phases respectively corresponding to A, B and C clock signals ACK, BCK and CCK which determine the edge timing of a waveform. The timing generator 300 generates clock pulses of the clock signals ACK, BCK and CCK in desired phases that correspond to respective cycles of the pattern data.

The phase change circuit 101 permits high-speed processing of the pattern data and makes the phase setting range for A, B and C clock signals ACK, BCK and CCK wider than the pattern data cycle period. The phase change circuit 101 changes the pattern data, which is entered from an input terminal Din, from the phase of the M clock signal MCK to the phases of the clock signals ACK, BCK and CCK and provides outputs to output terminals DA, DB and DC. As is well-known in the art, when the pattern data from the pattern generator 200 is input into the phase change circuit, four NAND gates are opened one by one in a cyclic manner by a modulo 4 counter CO and a decoder DO upon each occurrence of the clock MCK, by which are generated four frequency-divided clocks shown FIG. 3, Rows, C, D, E and F, and these clocks are provided to flip-flops F0 through F3, respectively. By this, pattern data shown in FIG. 3, Row A is converted into four parallel pieces of data each having a cycle length four times longer than the original data, as depicted on Rows G, H, I and J.

Supplied with the count value of a modulo 4 counter C1 which counts the clock ACK, a decoder D1 provides output signals (FIG. 3, Rows L, M, N and O) to its output terminals 0, 1, 2 and 3. These output signals are used to sequentially extract pattern data from corresponding cycles of the above-said four parallel pieces of data and convert them to serial data, by which pattern data synchronized with the phase of the clock ACK is output from the terminal DA (Row P). By this, even if the phase difference between the clock signals MCK and ACK is more than one cycle, the phase change can be made without decreasing the speed of data being subjected to high-speed processing. Similarly, as long as the pattern data is within the range of four-fold enlarged data cycle, it can also be changed to the phase of the clock signal ACK which exceeds the period of the clock signal MCK, like a clock n+1 of the A clock signal ACK. For the clock signals BCK and CCK as well, this phase change circuit operates in the same manner as for the clock signal ACK.

An enable signal generator 103 generates A SET, A RESET, B SET, B RESET, C SET and C RESET signals for controlling the A, B and C clock signals, on the basis of the pieces of pattern data changed to the phases of the A, B and C clock signals ACK, BCK and CCK and the waveform mode prestored in the waveform mode register 105. These signals will hereinafter be referred to generically as enable data and their meanings are such as given below in Table 2.

TABLE 2

Contents of Enable Data

| Name | Meaning |
|---|---|
| A SET | This determines whether to use the A clock as a SET signal. |
| A RESET | This determines whether to use the A clock as a RESET signal. |
| B SET | This determines whether to use the B clock as a SET signal. |
| B RESET | This determines whether to use the B clock as a RESET signal. |
| C SET | This determines whether to use the C clock as a SET signal. |
| C RESET | This determines whether to use the C clock as a RESET signal. |

When any of the signals is a "0" it means "disable," whereas in the case of a "1" it means "enable."

A waveform generator 106 generates SET and RESET signals on the basis of the enable data from the enable signal generator 103 and tile A, B and C clock signals ACK, BCK and CCK from the timing generator 300. The waveform generator 106 applies the SET and RESET signals to SET and RESET terminals of an R-S flip-flop, thereby shaping a driver output waveform.

The waveform shaper 100, in short, shapes the driver output waveform by selecting the A, B and C clock signals from the timing generator 300 as the SET or RESET signals on the basis of the fixed waveform data set in the waveform mode register 105 and the pattern data from the pattern generator 200.

Conventionally, the following two methods are used to change the driver output waveform in real time.

Method 1

By inhibiting desired clocks of the A, B and C clock signals being generated from the timing generator 300 for a desired cycle, the SET or RESET signal that is used for waveform shaping in the waveform shaper 106 is inhibited, thereby switching the driver output waveform to a desired one in real time.

Method 2

By resetting one of the A, B and C clock signals which is to be inhibited in a clock select register 107. The clock signal thus preset in the select register 107 is inhibited in an inhibit circuit 104 with inhibit data (a signal indicating an inhibit cycle of each of the A, B and C clock signals) synchronized with the pattern data from the pattern generator 200 and changing in real time. In this way, the SET or RESET signal that is used for waveform shaping in the waveform generator 106 is inhibited, and the driver output waveform is switched in real time.

According to Method 1, since the A, B and C clock signals are partly inhibited for only a specified cycle in the timing generator 300, the number of M clocks and the number of A, B and C clock inputs do not match in the pattern data phase change circuit 101, putting the cycle of output pattern data out of order (see the timing chart of FIG. 4 wherein a clock n+1 is inhibited.) As the result of this, in the waveform generator 106 the enable data which is input thereto from the enable signal generator 103 for selecting the A, B and C clock signals as SET and RESET signals and the A, B and C clock signals do not exactly correspond in cycle, and hence the driver output waveform cannot correctly be switched.

If such a phase change circuit 101 as shown in FIG. 2 is not used, then the cycle of the pattern data will not become out of order, and consequently, the driver output waveform can be switched by controlling the A, B and C clock pulses. However, the pattern data cannot be handled in the phases of the A, B and C clock signals unless the period of the pattern data is increased by a value equal to the phase difference between the M clock signal and the A, B and C clock signals. Hence, high-speed processing cannot be achieved nor is it possible to set the A, B and C clock signals of a period exceeding that of the M clock signal. For the reasons given above, Method 1 is incapable of waveform switching from the waveform mode (XOR, NRZ waveform) dependent on the pattern data from the pattern data generator during high-speed operation.

According to Method 2, since the A, B and C clock signals that are input into the waveform generator 106 are partly inhibited by the inhibit circuit 104, it is impossible to perform waveform switching which calls for adding the SET or RESET signal in the waveform generator 106, such as the switching from an NRZ waveform to an RZ waveform. In the case of switching an XOR waveform (Row H) to the RZ waveform (Row I) as shown in FIG. 5, the A, B and C clock signals are all inhibited to inhibit the generation of the SET and RESET signals shown on Rows g and G when the pattern data on Row B is at the "0" level, whereas when the data is at the "1" level, it is necessary to inhibit the A clock signal alone. Thus, the clock signal to be inhibited needs to be changed according to the pattern data, but it is impossible to change the setting of the selected clock in the select register 107 during the generation of the pattern data; hence, such waveform switching as mentioned above is impossible.

An object of the present invention is to provide a waveform shaper for semiconductor testing devices which obviates the abovementioned problems of the prior art.

SUMMARY OF THE PRESENT INVENTION

The waveform shaper for semiconductor testing devices according to the present invention includes, a timing generator which generates a plurality of clock signals for determining the edge timing of a driver output waveform, a waveform mode storage which stores data for selecting clock signals which are used corresponding to a plurality of waveform modes, a pattern generator which generates pattern data and control data synchronized therewith for selecting a waveform mode in real time, an enable data generator which generates enable data for determining whether to use a clock that determines the timing for switching the driver output waveform, on the basis of the data for selecting the clock signal corresponding to the selected waveform mode and the pattern data, and a waveform generator which generates the driver output waveform on the basis of the enable data and the clock that determines the edge timing of the driver output waveform.

In the present invention, the control data from the pattern generator is used to switch the waveform mode in real time, permitting the switching of the driver output waveform.

BRIEF DESCRIPTION OF THE DRAWINGS

FIG. 9 is a block diagram illustrating another embodiment of the present invention.

DETAILED DESCRIPTION OF THE PRESENT INVENTION

Figure 6:
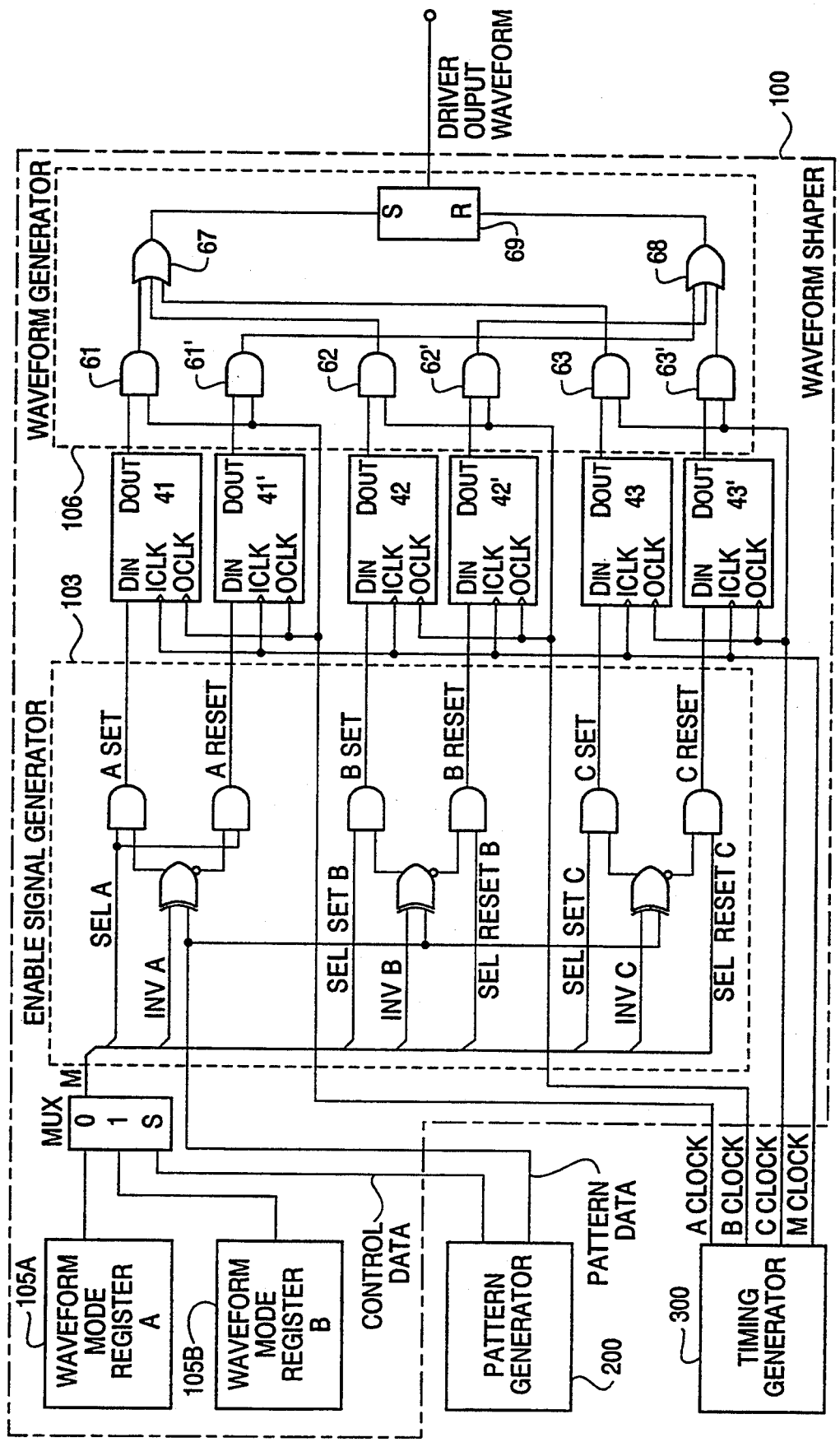
FIG. 6 is a diagram illustrating the waveform shaper according to the present invention.

An embodiment of the present invention will be described with reference to FIG. 6. In this embodiment, as shown in FIG. 6, two waveform mode registers 105A and 105B are provided to store two kinds of waveform modes A and B. The waveform modes A and B, prestored in the waveform mode registers 105A and 105B, are selectively output therefrom through a multiplexer MUX in accordance with control data that is available from a pattern generator 200 and varies in real time in synchronization with pattern data also available therefrom. Of course, the number of waveform modes that can be selected may also be increased by increasing the number of waveform mode registers used.

Based on the selected waveform mode and the pattern data from the pattern generator 200, an enable signal generator 103 generates enable data that is used to determine whether OR NOT A, B and C clock signals ACK, BCK and CCK generated from a timing generator 300 are to be used as SET or RESET signals, respectively.

Figure 1:
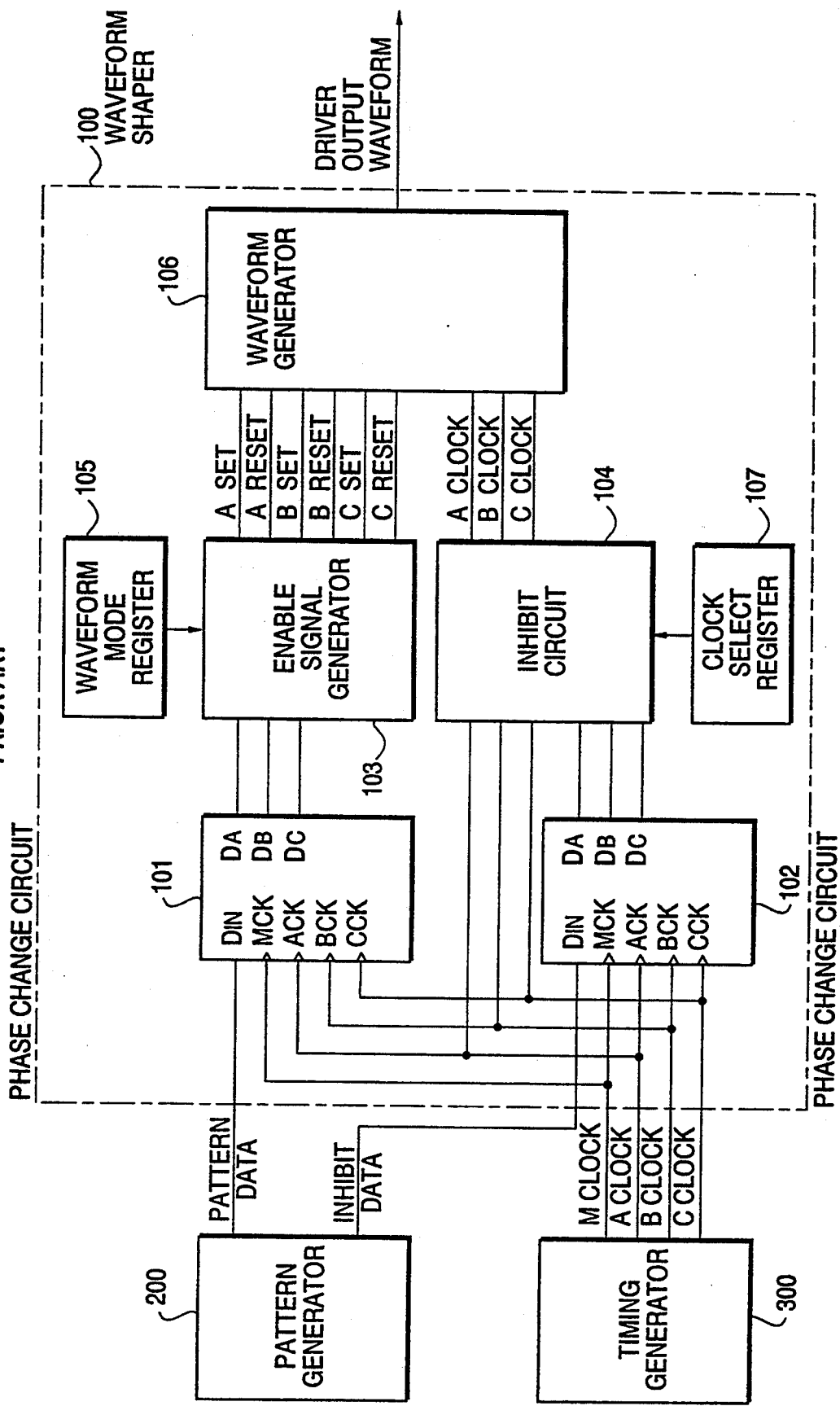
FIG. 1 is a diagram showing a conventional waveform shaper.
Figure 2:
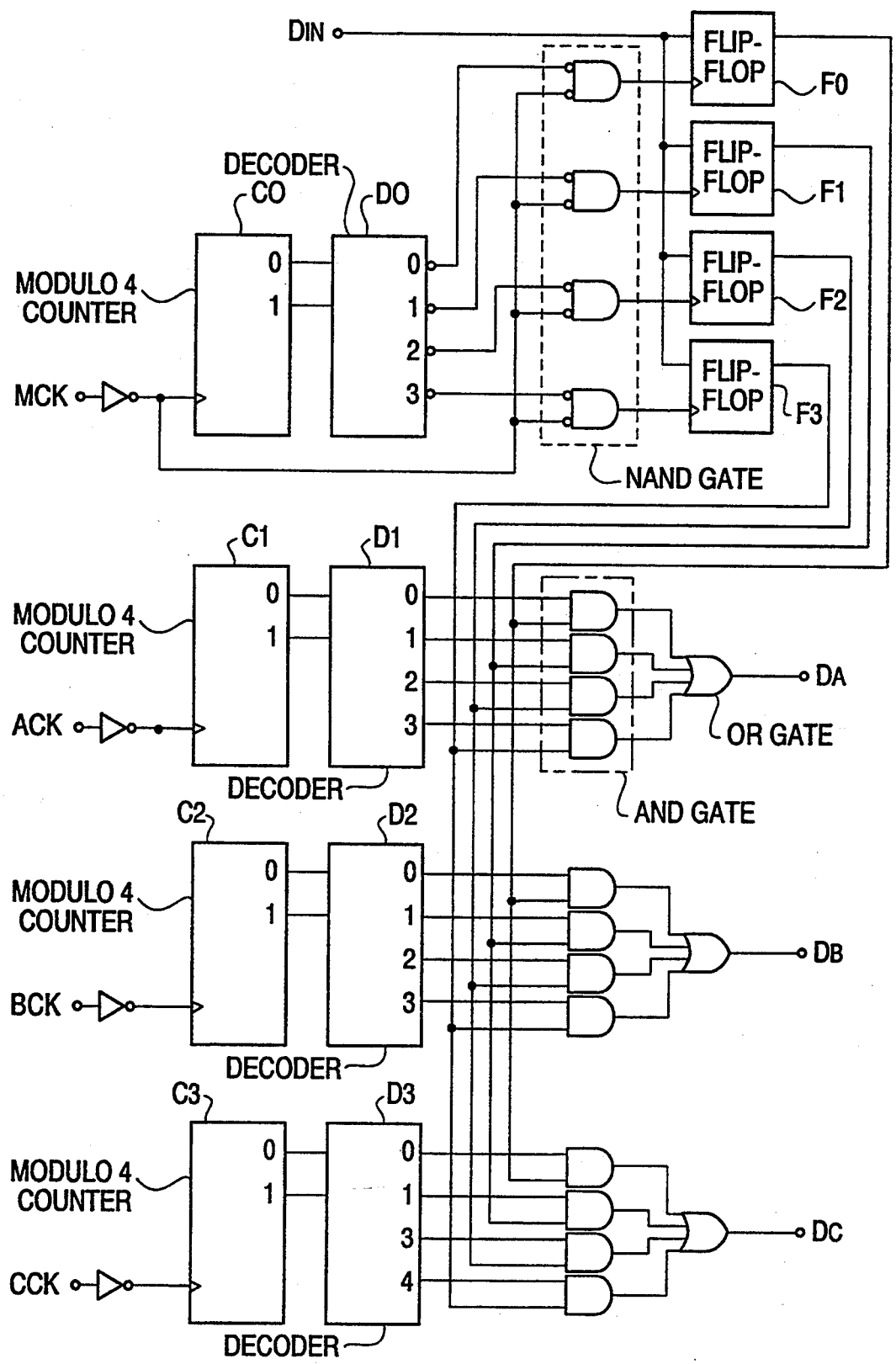
FIG. 2 is a diagram for explaining a prior art example of a phase change circuit in FIG. 1.
Figure 3:
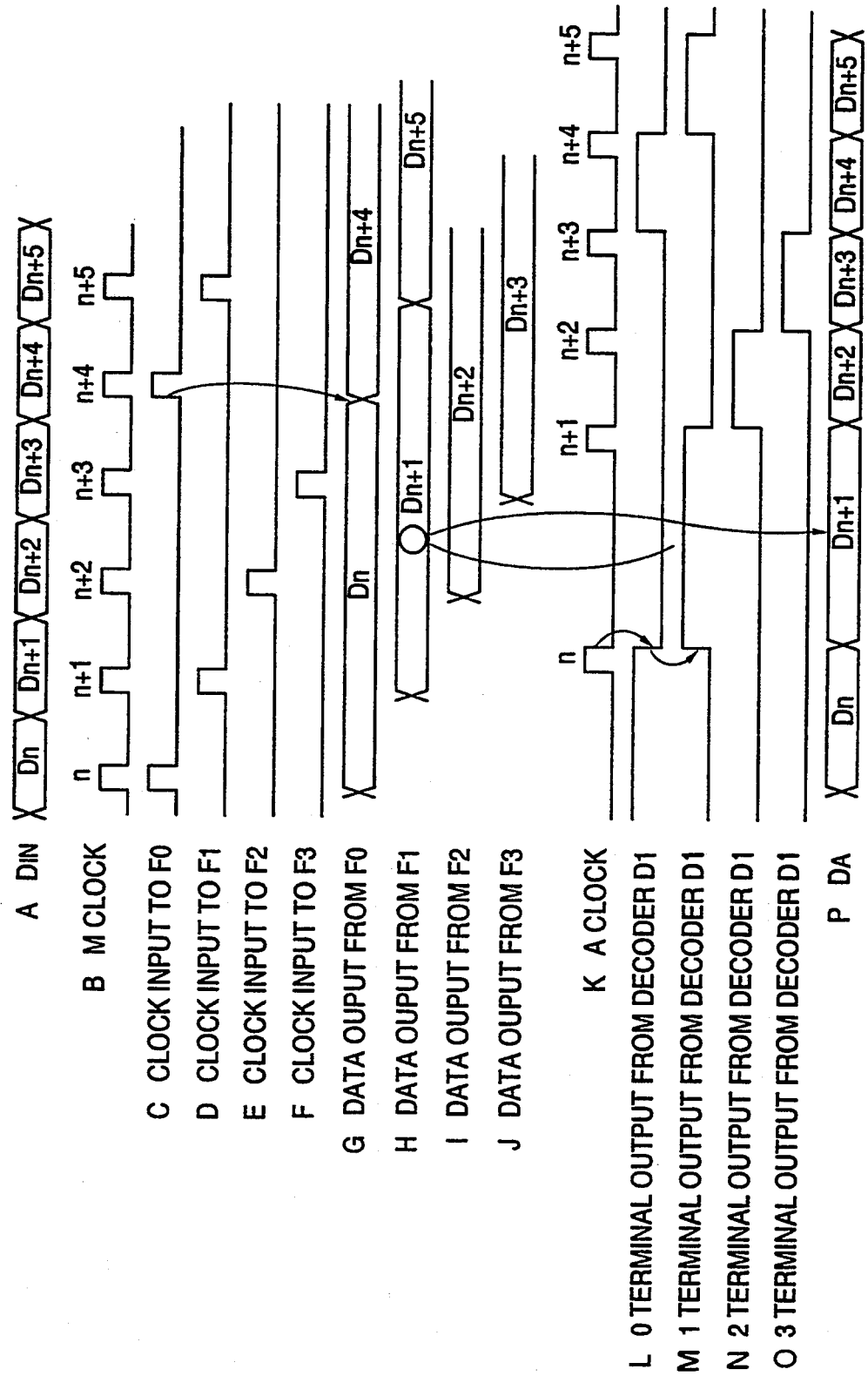
FIG. 3 is a timing chart of the conventional phase change circuit.
Figure 4:
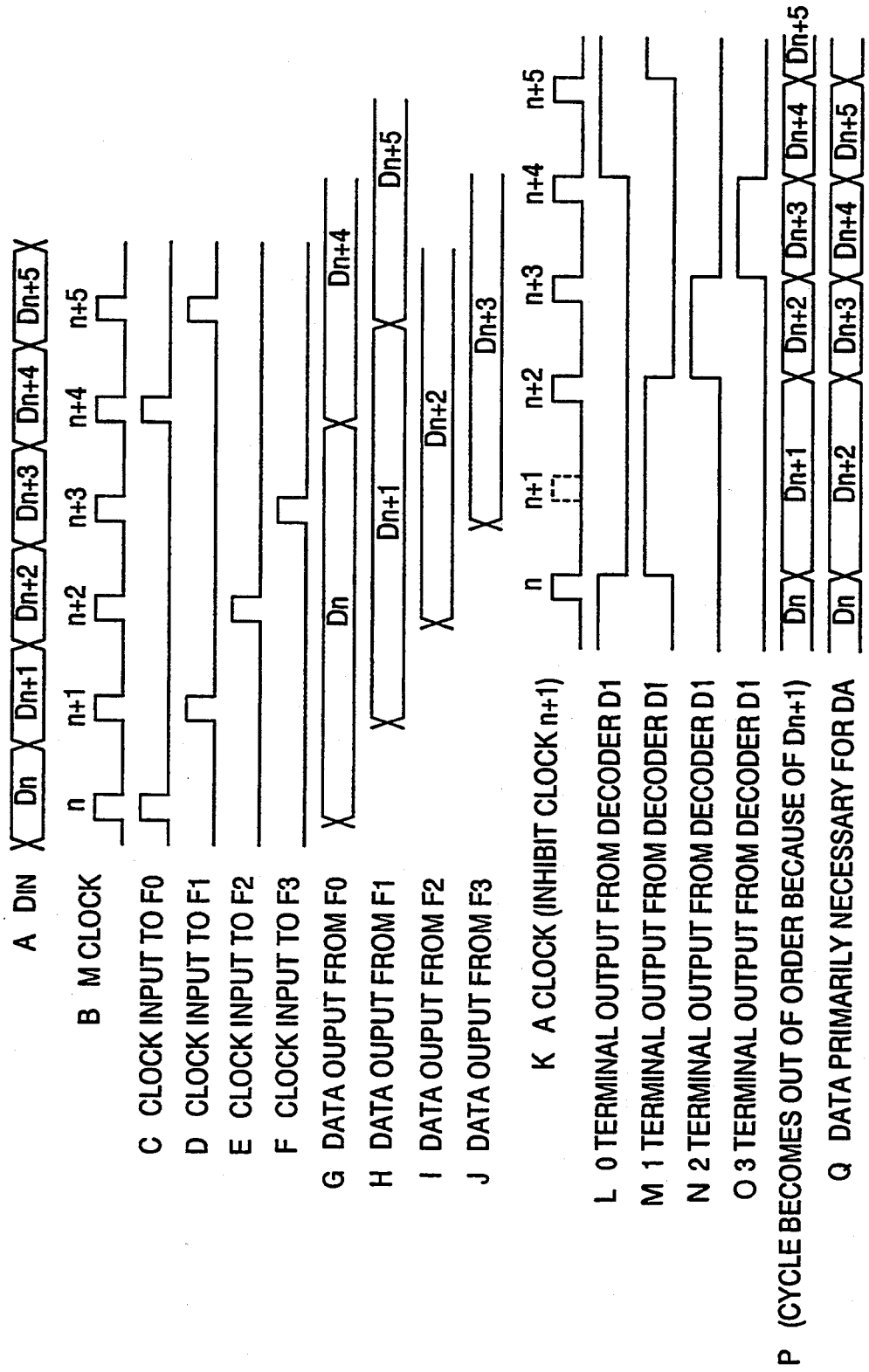
FIG. 4 is an operation timing chart in the case where a clock signal ACK is partly inhibited.
Figure 5:
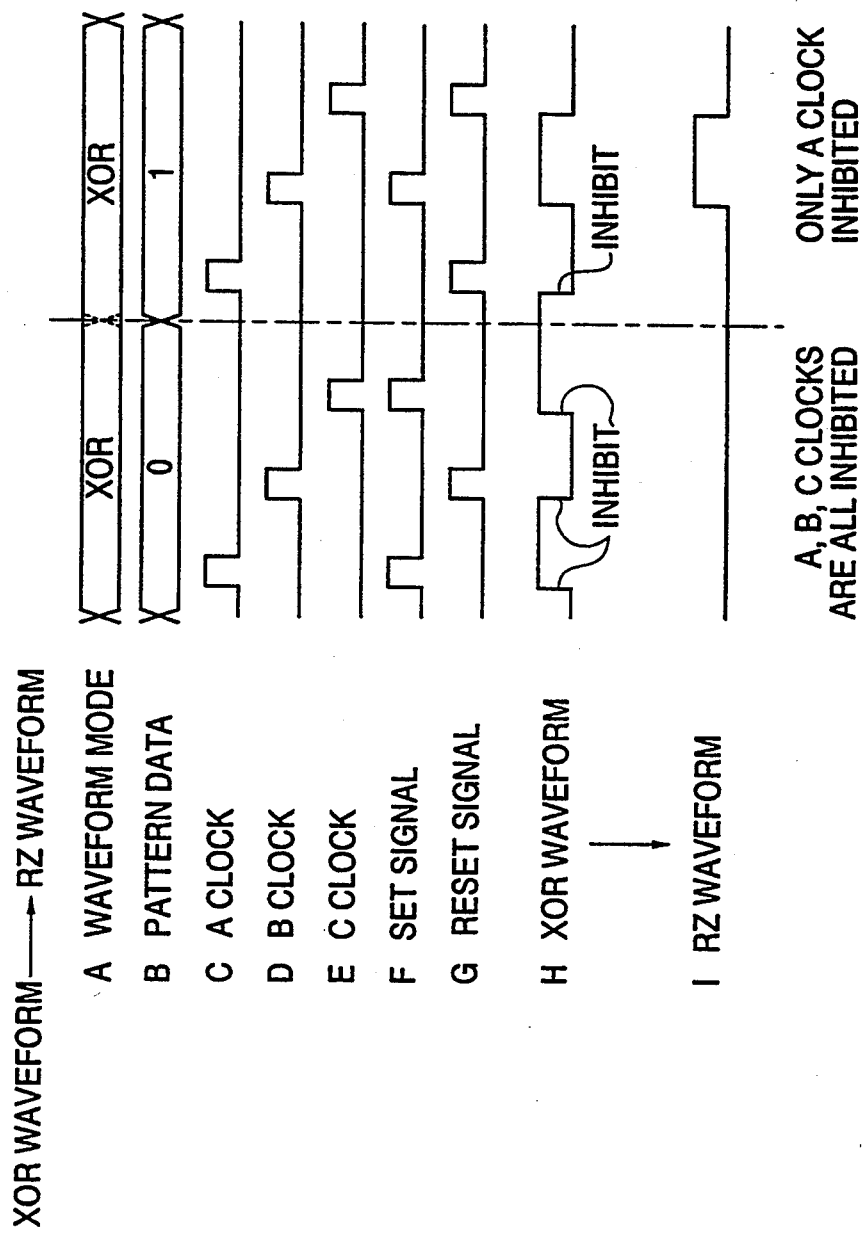
FIG. 5 is an operation timing chart in the case of switching a waveform from an XOR mode to an RZ mode.
Figure 7:
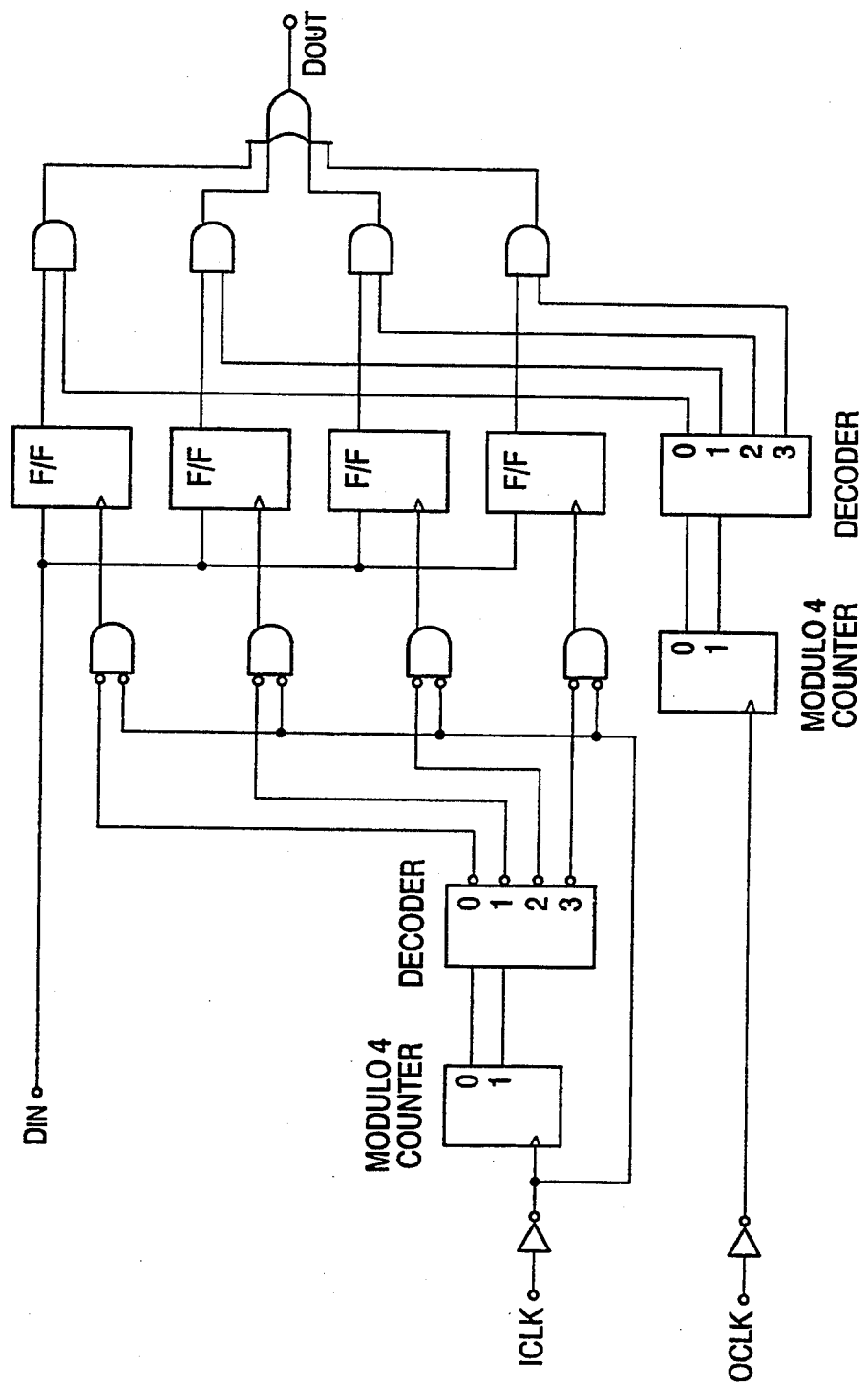
FIG. 7 is a diagram showing the construction of a phase change circuit in FIG. 6.

Phase change circuits 41 through 43 and 41' through 43' change the phase of the enable data from the phase of an M clock signal to the phases of the A, B and C clock signals ACK, BCK and CCK. That is, the timing of the enable data corresponds to the timing of clock signals A, B, and C. These phase change circuits are all identical in construction. FIG. 7 shows one of them in block form. Its operation and function are the same as those of the conventional phase change circuit depicted in FIG. 2.

In a waveform generator 106 set enable data and reset enable data provided from the phase change circuits 41 through 43 and 41' through 43' and the corresponding A, B and C clock signals ACK, BCK and CCK are ANDed by AND gates 61 through 63 and 61' through 63', and the A, B and C clock signals enabled thereby are generated as SET or RESET signals. The SET and RESET signals have their timings corresponding to those of the A, B, and C clock signals of these A, B and C clock signals are output via OR gates 67 and 68 and are provided to SET and RESET terminals of an R-S flip-flop 69, respectively, thereby generating a driver output waveform.

A description will be given of the case of selectively using XOR and RZBC waveforms, for instance. The term "RZBC" means an RZ waveform which rises according to the B clock signal and falls according to the C clock signal. In this instance, KOR and RZBC modes are set in the waveform mode registers 105A and 105B, respectively. The contents of the waveform mode registers 105A and 105B are as shown below in Table 3.

TABLE 3

| | Contents of waveform Mode Registers 105A and 105B | |
|---|---|---|
| Waveform Mode | 105A XOR Mode | 105B RZBC Mode |
| SEL A | 1 | 0 |
| SEL SET B | 1 | 1 |
| SEL RESET B | 1 | 0 |
| SEL SET C | 1 | 0 |
| SEL RESET C | 1 | 1 |
| INV A | 1 | 0 |
| INV B | 0 | 0 |
| INV C | 1 | 1 |

Figure 8:
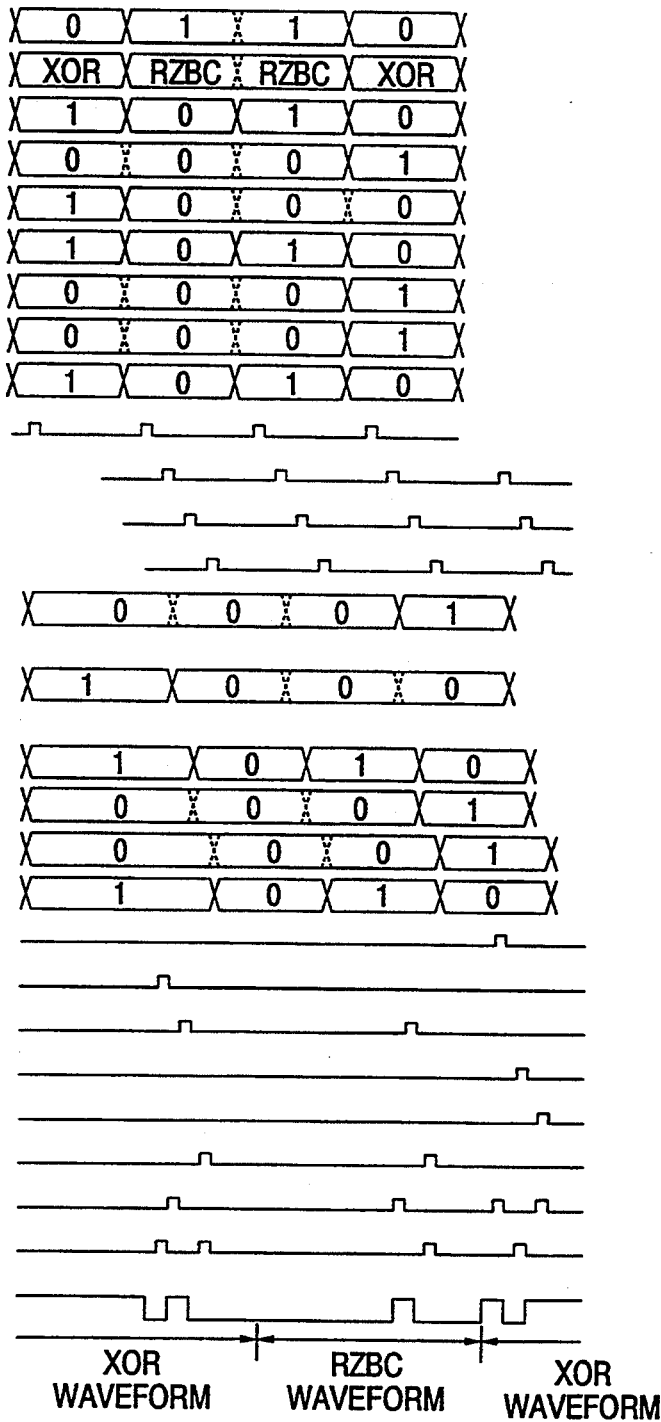
FIG. 8 is an operation timing chart of the waveform shaper shown in FIG. 6.

In FIG. 8, Rows D through V there is shown an operation timing chart in the case where pattern data shown on Row C and control data on Row A for causing the waveform modes to be outputted therefrom in a waveform mode shown on Row B are generated by the pattern generator 200, with the waveform mode registers 105A and 105B set as shown in above Table 3. In FIGS. 6 and 8, when supplied with control data CD from the pattern generator 200, the multiplexer MUX selects first, the waveform mode XOR, second, the waveform mode RZBC, third, RZBC, and fourth, XOR. The waveform ode which appears at the output of the multiplexer MUX by the selection thereof as stated above is hereinafter referred to as the waveform mode M. Supplied with the waveform mode M and the pattern data PD from the pattern generator 200, the enable signal generator 103 outputs enable data A SET, A RESET, B SET, B RESET, C SET and C RESET (rows D through I) which determine whether or not the A, B and C clock signals (Rows K, L and M) are to be used as SET or RESET signals. These pieces of enable data are provided to the phase change circuits 41 through 43 and 41' through 43', wherein they are changed in the phases thereof from the phase of the M clock (Row J) to the phases of the corresponding A, B and C clock signals ACK, BCK and CCK, respectively. The outputs from the phase change circuits 41 through 43 and 41' through 43', that is, the phase-changed enable data outputs are such as depicted on Rows N, O, P and N', O', P'.

These phase-changed enable data outputs and the A, B and C clock signals from the timing generator 300 are provided to the AND gates 61 through 63 and 61' through 63', respectively, and the A, B and C signals enabled in these gates are generated as SET and RESET signals, as shown in FIG. 8, Rows Q, R, S and Q', R', S'.

These SET and RESET signals are applied to the OR gates 67 and 68, from which they are provided as a SET signal (Row T) and a RESET signal (Row U) to the R-S flip-flop 69. By applying the SET signal and the RESET signal to the SET terminal and the RESET terminal of the R-S flip-flop 69, it is possible to generate the driver output waveform shown in FIG. 8, Row V.

In this way, the waveform mode M, selected on the basis of the control data CD from the pattern generator 200, appears in the driver output waveform, permitting switching between the XOR waveform and the RZBC waveform. As referred to previously, three or more kinds of waveform modes can similarly be switched among them by using three or more waveform mode registers or memories.

While in the FIG. 6 embodiment the waveform mode is selected by the multiplexer MUX from one of the plurality of waveform mode registers 105A and 105B, it is also possible to employ a construction in which respective waveform modes are written in different address positions of one waveform mode storage and control data is provided thereto to read out therefrom a desired one of the prestored waveform modes. Moreover, by setting the phases of the A, B and C clock signals from the timing generator 300 within tile corresponding cycles of the M clock signal, the phase change circuits 41 through 43 and 41' through 43' in the embodiment of FIG. 6 may also be omitted. An embodiment of such a construction is illustrated in block form in FIG. 9.

In the embodiment of FIG. 9, a plurality of waveform modes are prestored in different address positions of a waveform mode storage 105 as mentioned above. The enable signal generator 103 is identical with that used in the FIG. 6 embodiment, and A, B, C set enable data and A, B, C reset enable data available therefrom are fed directly to the waveform generator 106 without being changed in phase. The waveform generator 106 is identical in construction with that in FIG. 6, and the A, B, C set enable data, the A, B, C reset enable data and the corresponding A, B, C clock signals are used to generate SET and RESET signals in the same fashion as described above. By applying these signals to set and reset terminals of a flip-flop, pattern data can be output as a drive waveform for a semiconductor device under test in a desired waveform mode. That is, the output waveform can be switched with the construction shown in FIG. 9 as well.

As described above, the driver output waveform can be made switchable by switching the waveform mode in real time on the basis of the control data from the pattern generator 200. It is also possible, with the provision of the phase change circuits 41 through 43 and 41' through 43', to perform high-speed data processing and to make the A, B, C signal phase setting ranges wider than the period of the M clock signal (that is, the cycle period of the pattern data).

Moreover, the present invention permits waveform switching without inhibiting the A, B, C clock signals, and hence precludes the possibility of the afore-mentioned deviation of their cycles.

I claim:

1. A waveform shaper for a semiconductor testing device testing a semiconductor, said waveform shaper comprising:

timing generating means for generating a plurality of clock signals, each of the plurality of clock signals for determining edge timing of a driver output waveform applied to the semiconductor being tested;

waveform mode storage means for storing a plurality of waveform modes, each of the plurality of waveform modes comprising data defining a driver output waveform;

pattern generating means for generating pattern data and control data synchronized therewith for selecting one of the plurality of waveform modes stored in said waveform mode storage means in real time;

enable data generating means, coupled to the waveform mode storage means and to the pattern generating means, for generating enable data for determining whether or not said plurality of clock signals are used as timing signals, each of the timing signals determining the edge timing of the driver output waveform on the basis of said pattern data and the data of said one of the plurality of waveform modes selected in accordance with said control data;

phase changing means, coupled to the enable data generating means, for changing phases of said enable data output from said enable data generating means to phases of the corresponding clock signals for determining the edge timing of the driver output waveform, for generating phase-changed enable data, and for outputting the phase-changed enable data; and waveform generating means, coupled to the phase changing means and to the timing generating means, for generating a driver output waveform on the basis of said phase-changed enable data and the plurality of clock signals for determining the edge timing of the driver output waveform;

wherein said control data from said pattern generating means is used to switch the one of the waveform modes in real time, permitting switching of the driver output waveform.

2. The waveform shaper of claim 1, wherein said waveform mode storage means comprises:

a plurality of register means, each register means for storing one of the plurality of waveform modes, and multiplexer means for selecting one of the plurality of waveform modes from said plurality of register means in accordance with said control data and for providing a selected waveform mode to said enable data generating means.

3. The waveform shaper of claim 1, wherein said waveform mode storage means comprises a memory which stores said plurality of waveform modes in different address positions, each waveform mode being read out from a corresponding one of said different address positions when accessed by said control data and provided to said enable data generating means.

4. A waveform shaper for a semiconductor testing device testing a semiconductor, said waveform shaper comprising:

timing generating means for generating a plurality of clock signals, each of the plurality of clock signals for determining edge timing of a driver output waveform applied to the semiconductor being tested;

waveform mode storage means for storing a plurality of waveform modes, each of the plurality of waveform modes comprising data defining a driver output waveform;

pattern generating means for generating pattern data and control data synchronized therewith for selecting one of the plurality of waveform modes stored in said waveform mode storage means in real time;

enable data generating means, coupled to the pattern generating means and to the waveform mode storage means, for generating enable data for determining whether or not said plurality of clock signals are used as timing signals, each of the timing signals determining the edge timing of the driver output waveform on the basis of said pattern data and the data of said one of the plurality of waveform modes selected in accordance with said control data; and waveform generating means, coupled to the timing generating means and to the enable data generating means, for generating a driver output waveform on the basis of said enable data and the plurality of clock signals for determining the edge timing of the driver output waveform;

said waveform mode storage means comprising:

a plurality of register means, each register means for storing the plurality of waveform modes, the each of the plurality of waveform modes being stored in a respective register means, and multiplexer means, coupled to the plurality of register means, for selecting the one of the plurality of waveform modes from said plurality of register means in accordance with said control data, and for providing the one of the plurality of waveform modes to said enable data generating means;

wherein said control data from said pattern generating means is used to switch the one of the plurality of waveform modes in real time, permitting switching of the driver output waveform.

5. A waveform shaper for a semiconductor testing device testing a semiconductor, said waveform shaper comprising:

timing generating means for generating a plurality of clock signals, each of the plurality of clock signals for determining edge timing of a driver output waveform applied to the semiconductor being tested;

waveform mode storage means for storing a plurality of waveform modes, each of the plurality of waveform modes comprising data defining a driver output waveform;

pattern generating means for generating pattern data and control data synchronized therewith for selecting one of the plurality of waveform modes stored in said waveform mode storage means in real time;

enable data generating means, coupled to the waveform mode storage means and to the pattern generating means, for generating enable data for determining whether or not said plurality of clock signals are used as timing signals, each of the timing signals determining the edge timing of the driver output waveform on the basis of said pattern data and the data of said one of the plurality of waveform modes selected in accordance with said control data; and waveform generating means, coupled to the timing generating means and to the enable data generating means, for generating a driver output waveform on the basis of said enable data and the plurality of clock signals for determining the edge timing of the driver output waveform, wherein said waveform mode storage means comprises a memory which stores said plurality of waveform modes in different address positions, each of the plurality of waveform modes being read out from a corresponding one of said different address positions when accessed by said control data and provided to said enable data generating means, and wherein said control data from said pattern generating means is used to switch the one of the plurality of waveform modes in real time, permitting switching of the driver output waveform.

* * * * *

UNITED STATES PATENT AND TRADEMARK OFFICE
CERTIFICATE OF CORRECTION

PATENT NO. : 5,406,132
DATED : April 11, 1995
INVENTOR(S) : Takahiro HOUSAKO

It is certified that error appears in the above-indentified patent and that said Letters Patent is hereby corrected as shown below:

Col. 1, line 53, delete "is to"; and
         line 58, change "ACK." to --ACK,--.
Col. 4, line 4, change "q" to --F--; and Col. 5, line 25, change "phase" (first occurrence) to
         --phases--; and
         line 49, after ""RZBC"" insert --waveform--.
Col. 6, line 10, after "selects" insert --,--;
         line 12, change "ode" to --mode--;
         line 15, change "Supplied" to --When supplied--; and
         line 63, change "tile" to --the--.

Signed and Sealed this

Eighteenth Day of July, 1995

Attest:

BRUCE LEHMAN

Attesting Officer          Commissioner of Patents and Trademarks

UNITED STATES PATENT AND TRADEMARK OFFICE
CERTIFICATE OF CORRECTION

PATENT NO.  : 5,406,132
DATED       : April 11, 1995
INVENTOR(S) : HOUSAKO

It is certified that error appears in the above-indentified patent and that said Letters Patent is hereby corrected as shown below:

Title Page, Item 57, line 5, change "patter" to --pattern--;

Column 4, line 21, delete ",".

Signed and Sealed this

Seventh Day of November, 1995

Attest:

BRUCE LEHMAN

Attesting Officer    Commissioner of Patents and Trademarks